United States Patent
Verlinden et al.

(10) Patent No.: US 11,431,292 B2
(45) Date of Patent: Aug. 30, 2022

(54) CRYSTAL OSCILLATOR START-UP CIRCUIT AND METHOD

(71) Applicant: NXP B.V., Eindhoven (NL)

(72) Inventors: Jos Verlinden, Wachtendonk (DE);
Rehan Ahmed, Eindhoven (NL);
Reinier Hoogendoorn, Veldhoven (NL)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 17/451,262

(22) Filed: Oct. 18, 2021

(65) Prior Publication Data

US 2022/0173699 A1 Jun. 2, 2022

(30) Foreign Application Priority Data

Nov. 30, 2020 (EP) .................................... 20210648

(51) Int. Cl.
*H03B 5/32* (2006.01)
*H03B 5/06* (2006.01)
(Continued)

(52) U.S. Cl.
CPC .............. *H03B 5/364* (2013.01); *H03B 5/06* (2013.01); *H03B 5/32* (2013.01); *H03F 3/45269* (2013.01);
(Continued)

(58) Field of Classification Search
CPC ... H03B 5/06; H03B 5/30; H03B 5/32; H03B 5/36; H03B 5/362; H03B 5/364;
(Continued)

(56) References Cited

U.S. PATENT DOCUMENTS 10,931,232 B2 2/2021 Van Der Zee et al.
10,951,166 B1 * 3/2021 Kruiskamp .............. H03B 5/06
(Continued)

FOREIGN PATENT DOCUMENTS

EP 2693629 A2 2/2014

OTHER PUBLICATIONS

Chang, Wei-Sung, et al., "An Energy-Efficient Self-Charged Crystal Oscillator with a Quadrature-Phase Shifter Technique", IEEE Asian Solid-State Circuits Conference, Nov. 6, 2017, vol. S4-4(2143), IEEE, Piscataway, NJ, USA, pp. 53-56.
(Continued)

*Primary Examiner* — Levi Gannon

(57) ABSTRACT

A circuit and method for starting-up a crystal oscillator is described. A crystal resonator is configured to be coupled to a start-up circuit including an H-bridge circuit having a number of switches. A plurality of switch control signals are generated in response to detecting a zero-crossing event of the motional current in the crystal resonator. The switches of the H-bridge circuit are controlled by the switch control signals to apply a voltage to the terminals of the crystal resonator in a first polarity during a first switch control phase and a second opposite polarity during a second switch control phase. During a respective first subphase of the respective switch control phase, the plurality of switches are configured in a first configuration to couple the supply node to a respective crystal resonator terminal. During a respective second subphase of the respective switch control phase the plurality of switches are configured in a second configuration to couple the supply node to the respective crystal resonator terminal. The resistance between the supply node and the respective crystal resonator terminal is larger in the second configuration than the first configuration. A zero-
(Continued)

crossing is detected during each respective second sub-phase.

20 Claims, 10 Drawing Sheets

(51) Int. Cl.
    *H03L 3/00*     (2006.01)
    *H03B 5/36*     (2006.01)
    *H03F 3/45*     (2006.01)

(52) U.S. Cl.
    CPC ........ *H03L 3/00* (2013.01); *H03B 2200/0094* (2013.01)

(58) Field of Classification Search
    CPC ............... H03B 5/366; H03B 5/368; H03B 2200/0094; H03L 3/00; H03F 3/45269
    USPC ...... 331/116 FE, 116 R, 154, 158, 172, 173, 331/182, 183
    See application file for complete search history.

(56) References Cited

U.S. PATENT DOCUMENTS

| | | | | |
|---|---|---|---|---|
| 11,128,306 B1* | 9/2021 | Pietri | ................ | H03L 7/0992 |
| 2012/0126907 A1* | 5/2012 | Nakamoto | ............... | H03B 5/36 |
| | | | | 331/155 |
| 2014/0091869 A1 | 4/2014 | Tham | | |
| 2014/0320223 A1* | 10/2014 | Ozawa | ................ | H03B 5/364 |
| | | | | 310/317 |
| 2016/0373055 A1* | 12/2016 | Kumar | ................ | H03B 5/364 |
| 2016/0380590 A1* | 12/2016 | Khalili | ................ | H03B 5/364 |
| | | | | 331/116 FE |
| 2018/0138860 A1* | 5/2018 | Zhang | ................ | H03B 5/1234 |

OTHER PUBLICATIONS

Esmaeelzadeh, Hani et al., "A Quick Startup Technique for High-Q Oscillators Using Precisely Timed Energy Injection", IEEE Journal of Solid-State Circuits, Mar. 1, 2018, vol. 53, No. 3, IEEE, Piscataway, NJ, USA, pp. 692-702.

Lechevallier, Joeri B. et al.: "Fast & Energy Efficient Start-Up of Crystal Oscillators by Self-Timed Energy Injection," IEEE Journal of Solid-State Circuits, vol. 54, No. 11, Nov. 2019, pp. 3107-3117.

Megawer, Karim M. et al.: "A 54MHz Crystal Oscillator with 30× Start-Up Time Reduction Using 2-Step Injection in 65nm CMOS," ISSCC 2019 / Session 18 / Analog Techniques / 18.5, 2019 IEEE International Solid-State Circuits Conference, Feb. 17-21, 2019, San Francisco, CA, USA, pp. 302-304.

Verhoef, Bram et al.: "A 32MHz Crystal Oscillator with Fast Start-up Using Synchronized Signal Injection," ISSCC 2019 / Session 18 / Analog Techniques / 18.6, 2019 IEEE International Solid-State Circuits Conference, Feb. 17-21, 2019, San Francisco, CA, USA, pp. 304-306.

\* cited by examiner

Leakage compensation block mimicking leakage of in_p at in_n

800

CRYSTAL OSCILLATOR START-UP CIRCUIT AND METHOD

CROSS-REFERENCE TO RELATED APPLICATIONS

This application claims the priority under 35 U.S.C. § 119 of European Patent application no. 20210648.0, filed on 30 Nov. 2020, the contents of which are incorporated by reference herein.

FIELD

This disclosure relates to a circuit and method for start-up of a crystal oscillator.

BACKGROUND

Short start-up time and low-energy is a key feature in many products. Especially for low power wireless duty-cycled systems (IoT, BLE, Car keys) energy is often scarce since it is delivered by batteries or even by energy harvesting. The start-up time and start-up energy of the system is often mainly determined by the crystal oscillator (XO) and resonator for example MEMS resonator, crystal, ceramic or RLC circuit The typical way of starting-up an XO is by noise which is amplified by the gain-stage. The initial noise however is small and not well defined. The start-up time is relatively long and limited to a certain minimum value depending amongst others on the initial noise value. A first step to improve the start-up time is to give the XO an initial "kick" or pulse at start-up. In this way the initial motional current in the Crystal (Xtal) is well defined. The maximum initial motional current however is limited by the maximum possible kick amplitude on the Crystal and hence is limited by the supply voltage. The start-up time further can be improved by periodically giving pulses in a well-defined manner. By applying pulses in a well-defined manner, the motional current can be increased constantly up to the final value. If the frequency and phase of the injected energy is exactly the same as the motional current in Crystal, then the start-up time is optimized to the minimum possible value.

SUMMARY

Various aspects of the disclosure are defined in the accompanying claims. In a first aspect, there is defined a crystal oscillator start-up circuit comprising: an H-bridge circuit comprising a plurality of switches configured to be coupled to a crystal resonator; a comparator having a first comparator input configured to be switchably coupled to a terminal of the crystal resonator, a second comparator input configured to be coupled to a supply node, a comparator clock input, and a comparator output configured to transition between a first state and a second state in response to a zero-crossing event of the motional current in the crystal resonator; a comparator clock generator having a first comparator clock generator input coupled to the comparator output, a second comparator clock generator input configured to receive a start signal, and a comparator clock generator output coupled to the comparator clock input; a switch control generator coupled to the comparator clock output and configured to generate a plurality of switch control signals synchronous with respect to the comparator clock to control the plurality of switches, the plurality of switches being configurable to apply a voltage source to the crystal resonator terminals in a first polarity during a first switch control phase and a second opposite polarity during a second switch control phase and wherein during a respective first subphase of the respective switch control phase, the plurality of switches are configured in a first configuration to couple the supply node to a respective crystal resonator terminal; and during a respective second subphase the plurality of switches are configured in a second configuration to couple the supply node to the respective crystal resonator terminal; wherein the resistance between the supply node and the respective crystal resonator terminal is larger in the second configuration than the first configuration; and wherein the switch control generator is further configured to couple the first comparator input to the respective crystal resonator terminal during of each of the respective second sub-phases.

In one or more embodiments, the crystal oscillator start-up circuit may be configured to alternate between the first switch control phase and the second switch control phase each cycle of the comparator clock.

In one or more embodiments, the comparator may be configured to calibrate a comparator offset voltage during a first phase of the comparator clock cycle and to compare the inputs during a second phase of the comparator clock cycle.

In one or more embodiments, the comparator may be enabled during each respective second subphase.

In one or more embodiments, the comparator may comprise: a differential amplifier stage comprising: an operational transconductance amplifier (OTA); a first capacitor coupled to a first OTA input; a second capacitor coupled to a second OTA input, wherein the comparator is configured to receive the comparator clock which defines a calibration phase and a comparison phase, wherein during the calibration phase the comparator is configured to control a plurality of comparator switches to: switchably couple the first comparator input to the first OTA input via the first capacitor; and switchably couple the second comparator input to the second OTA input via the second capacitor; and wherein during the comparison phase, the comparator is configured to control the plurality of comparator switches to: switchably couple the first comparator input to the first OTA input via the first capacitor and to the second OTA input via the second capacitor; and switchably couple a first OTA output to the first OTA input, and a second OTA output to the second OTA input.

In one or more embodiments, the comparator may comprise a single ended output stage OTA coupled to the output of the differential amplifier stage and having a first input coupled to a first OTA output of the differential amplifier stage, a second input coupled to the second OTA output, and an output coupled to a buffer wherein the buffer is configured to have a shifted voltage trip level.

In one or more embodiments, the plurality of switches may further comprise: a first switch and a third switch arranged in series between the supply node and a second supply node; a second switch and a fourth switch arranged in series between the supply node and the second supply node; a first sensing switch arranged in parallel with the first switching; a second sensing switch arranged in parallel with the second switch; a first common node of the first switch and the third switch configured to be coupled to a first crystal resonator terminal and a second common node of the second switch and the fourth switch configured to be coupled to a second crystal resonator terminal.

In one or more embodiments, during the first switch control phase, the switch control generator may be further configured to: close the first sensing switch and the fourth switch and during the first sub-phase of the first switch control phase close the first switch; and during the second sub-phase of the first switch control phase, open the first switch; and during the second switch control phase, the switch control generator may be configured to: close the second sensing switch and the third switch and during the first sub-phase of the second switch control phase close the second switch; and during the second sub-phase of the second switch control phase open the second switch.

In one or more embodiments, the crystal oscillator start-up circuit may further comprise: a first comparison switch coupled between the first crystal resonator terminal and the first comparator input; and a second comparison switch coupled between the second crystal resonator terminal and the first comparator input; wherein the switch control generator is further configured to: close the first comparison switch during the second sub-phase of the first switch control phase; and close the second comparison switch during the second sub-phase of the second switch control phase.

In one or more embodiments, after at least two comparator clock cycles: during a respective first subphase of the respective switch control phase, the plurality of switches may be configured in a third configuration to couple the supply node to a respective crystal resonator terminal; and during a respective second subphase the plurality of switches are configured in a fourth configuration to couple the supply node to the respective crystal resonator terminal; wherein the resistance between the supply node and the respective crystal resonator terminal is larger in the fourth configuration than the third configuration and less than the second configuration.

In one or more embodiments, the switch control generator may be configured to control the plurality of switches to be configured in either the first and second configurations or the third and fourth configurations dependent on at least one of the number of comparator clock cycles and an amplitude of the crystal resonator signal.

In one or more embodiments, the crystal oscillator start-up circuit may further comprise a current leakage and delay compensation circuit coupled between a supply node and the second comparator input.

In one or more embodiments, the crystal oscillator start-up circuit may further comprise a one-shot circuit having an input coupled to a start enable input and an output coupled to the second comparator clock generator input.

In one or more embodiments, the comparator clock generator may further comprise a series arrangement of a first flip-flop, a delay element and a second flip-flop and an OR gate having first input coupled to the first comparator clock generator input, a second input coupled to the second comparator clock generator input and an output coupled to the clock inputs of the first and second flip-flops wherein the first flip-flop is configured as a toggle flip-flop and wherein the comparator clock output is a EXOR of the delayed output of the first flip-flop and the output of the second flip-flop.

In one or more embodiments, the switch control generator may further comprise a logic gate having a first input switch coupled to a start enable input, a second input coupled to the comparator clock generator output and a switch control flip-flop configured as a toggle flip-flop having a clock input coupled to the logic gate output and an output coupled to a second delay element; and a switch control logic module coupled to the switch control flip-flop output and the delayed switch control flip-flop output and configured to generate the switch control signals from the switch control flip-flop output and the delayed switch control flip-flop output from the second delay element.

In one or more embodiments, the first switch control phase signal may correspond to the switch control flip-flop output and the second switch control phase signal may correspond to the inverse of the switch control flip-flop output.

In one or more embodiments, the start-up circuit may be included in a crystal oscillator circuit further comprising a steady state circuit configured to be switchably coupled to the resonator crystal wherein during the start-up phase, the steady state circuit is decoupled from the resonator crystal and after the start-up phase, the H-bridge circuit is decoupled from the resonator crystal and the resonator crystal is coupled to the steady state circuit.

In one or more embodiments, an amplitude detector may be coupled to the resonator crystal wherein the circuit is configured to switch from the start-up phase to the steady-state phase in response to the amplitude exceeding a predetermined value.

Embodiments of the start-up circuit may be included in one of an Internet-of-Things device, a Bluetooth Device, and an Ultra-Wide-Band Device.

In a second aspect, there is defined a method of starting-up a crystal resonator configured to be coupled to a start-up circuit comprising an H-bridge circuit comprising a plurality of switches, the method comprising: generating a plurality of switch control signals in response to detecting a zero-crossing event of the motional current in the crystal resonator; controlling a plurality of switches of the H-bridge circuit with the switch control signals to apply a voltage to the terminals of the crystal resonator in a first polarity during a first switch control phase and a second opposite polarity during a second switch control phase; during a respective first subphase of the respective switch control phase, configuring the plurality of switches in a first configuration to couple the supply node to a respective crystal resonator terminal; and during a respective second subphase of the respective switch control phase configuring the plurality of switches in a second configuration to couple the supply node to the respective crystal resonator terminal; wherein the resistance between the supply node and the respective crystal resonator terminal is larger in the second configuration than the first configuration; and detecting each zero-crossing during each respective second sub-phase.

BRIEF DESCRIPTION OF THE DRAWINGS

In the figures and description like reference numerals refer to like features. Embodiments are now described in detail, by way of example only, illustrated by the accompanying drawings in which.

DETAILED DESCRIPTION OF EMBODIMENTS

Figure 1:
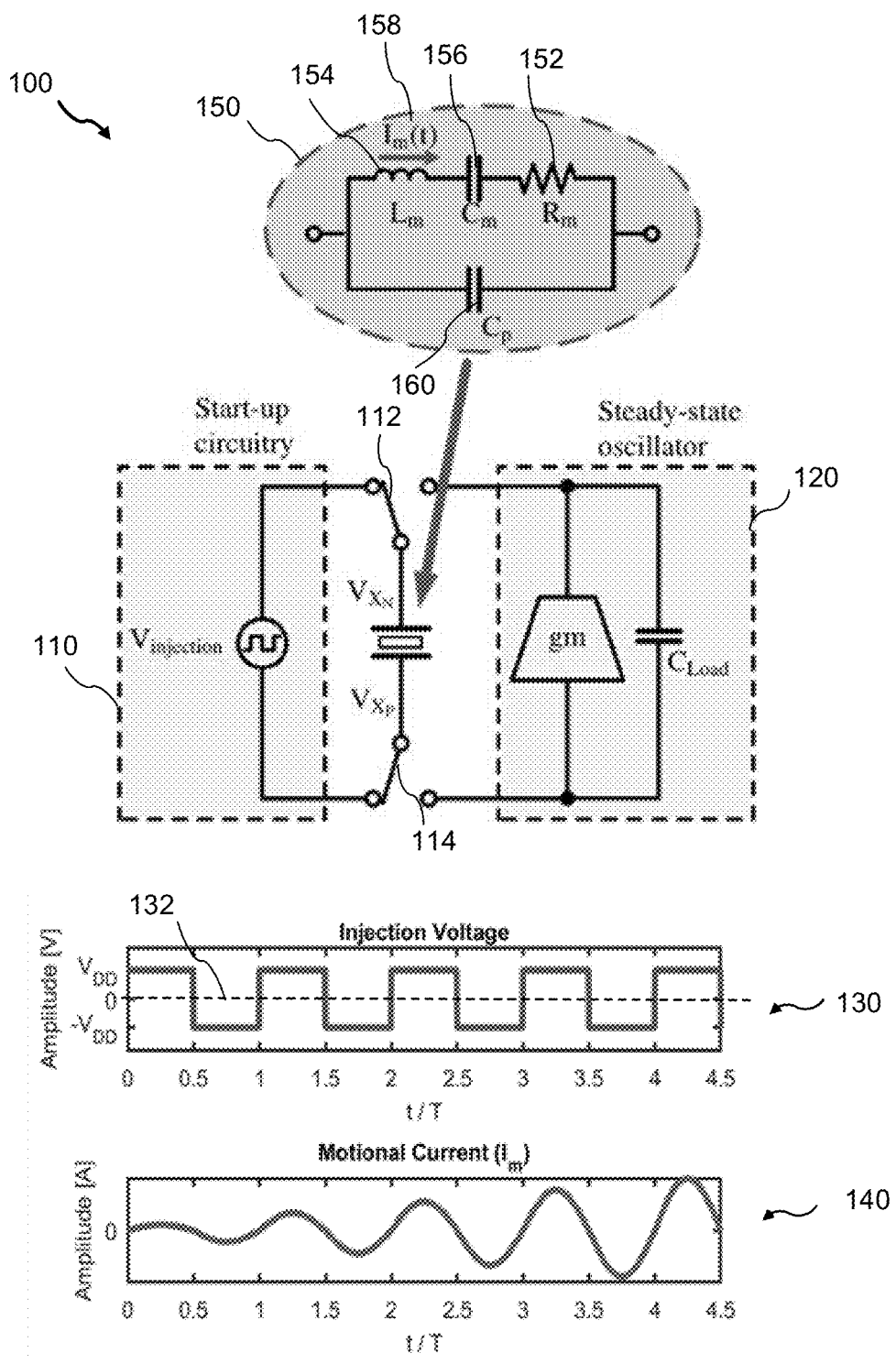
FIG. 1 shows an example crystal oscillator circuit and waveform of operation showing the injection voltages and motional current.

FIG. 1 shows an example schematic block diagram of a crystal oscillator circuit 100 including self-timed start-up circuit 110 and steady state oscillator circuit 120. The schematic block diagram of a crystal oscillator design 100 also includes example voltage waveforms 130 and the resulting motional current waveform 140. A crystal resonator 150 may be represented by a resistance 152, inductance 154, capacitance 156 (RLC) circuit, with a motional current 158 $\hat{I}_m$ passing therethrough, located in parallel to a capacitance 160.

In operation, initially the start-up circuit 110 is connected to the crystal resonator 150 for a certain period of time by switches 112, 114. During this time, the injection switching voltage 130 is alternating its polarity, around a zero crossing point 132, thereby increasing the motional current amplitude 140 over time. After the injection time provided by the start-up circuit 110 has sufficiently increased the amplitude of the oscillation of the motional current of the crystal oscillator, the crystal is then connected to the steady-state oscillator circuit 120 by switches 112, 114 which sustains the oscillation.

FIG. 1 also shows an example of a square-wave injection waveform 130 and the resulting growing motional current $\hat{I}_m$ 140. Provided that the crystal quality factor is high ($R_m$ is small), the motional current $\hat{I}_m$ 140 can be calculated to increase linearly over time with a slope of:

$$\frac{A}{2L_m},$$

where A is the amplitude of the fundamental of the injection waveform. The start-up slope is not dependent on the parasitic capacitance $C_P$ 160 as opposed to negative-resistance based circuits.

A circuit implementation of a source that places a voltage step over a crystal oscillator, whereby a polarity of a voltage source applied to a crystal oscillator is switched in response to a change of sign of a current passing through the crystal oscillator i.e. by detection of zero-crossing of the $\hat{I}_m$ 140 may provide a self-timed energy injection waveform to the crystal oscillator.

Figure 2:
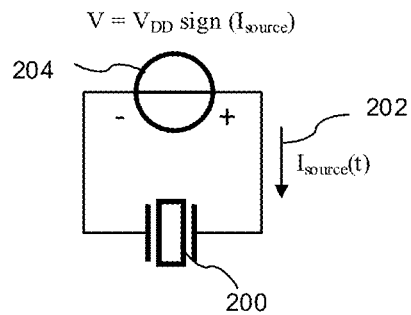
FIG. 2 illustrates an example simplified diagram of a crystal resonator which illustrates a self-timed energy injection technique.

FIG. 2 shows a simplified diagram of a crystal resonator 200 which illustrates a self-timed energy injection technique. As illustrated, any voltage source 204 used to drive crystal resonator 200, of which the polarity depends on the sign of the current passing through it, may be used as an injection waveform applied to the crystal resonator 200, where the injection waveform can be switched based on a sign of the current 202 passing through the crystal resonator 200. Since the injection waveform is self-timed, the signal frequency of the injection waveform automatically matches the crystal frequency without a need to resort to separate injection oscillators to create said waveforms.

Self-timed energy injection relies on measurement of the motional current $I_m$. It is, however, impossible to directly measure $I_m$, since the motional branch is in parallel with $C_p$; any current measured at the crystal oscillator terminals could flow in either the motional branch or $C_p$. This limitation can be overcome by ensuring that no current flows in the parasitic capacitance $C_p$ branch, such that the current measured at the crystal oscillator terminals can only flow through the motional branch. In some examples, this is achieved by applying (quasi-) constant voltages to the crystal oscillator.

In self-timed injection solutions, the zero crossings of the motional current have to be detected and the energy has to be injected without too much delay. The total delay (phase error) should be smaller than 90° of the oscillation period of the crystal. The zero crossings are detected by measuring the polarity of the voltage over the switch resistance ($R_{sw}$) of the H-bridge and the polarity is measured with a comparator.

The switch resistance should be large enough to create a voltage swing to be able to detect the zero crossings of the motional current with small enough delay. If the switch resistance however is too large, then the settling time is too long and consequently the rather small motional voltage swing cannot be detected. To reduce the settling time, the load capacitance $C_{load}$ on $X_p$ and $X_n$ may be reduced during start-up by disabling the capacitor bank implementing the load capacitance.

For switches implemented by MOS transistors, the settling time may be reduced by means of self-quenching NMOS switches which are connected in parallel to the PMOS switches, pulling up the voltage to the supply minus the threshold voltage of the NMOS (Vdd−Vth). The settling time is not optimized, since it still has to settle from Vdd−Vth to approximately Vdd. The PMOS switch resistance cannot be chosen too large since it will introduce a phase shift (phase error) between the motional current zero crossings and the zero crossing of the voltage over the switch resistance. Therefore the amplitude of the initial motional voltage swing Vsw_pk over the switch, depending on the Crystal specs and (parasitic) load capacitance may be very small for example only in the range ~0.1 mV-2 mV.

Furthermore, the motional current can only be detected if the amplitude of the voltage swing is larger than the offset of the comparator and offset due to leakage (from switches and pad) resulting in offset voltage $V_{offset}$. Even if the zero crossings of the small voltage swing can be detected, it is difficult to keep the phase error $\alpha_{error}$ small enough. The start-up time is proportional to the phase error, and if the phase error is larger than 90° the XO may not start-up at all.

The total phase error is equal to $\alpha_{error} = \alpha_{offset} + \alpha_{comp} + \alpha_{i-v}$, with:

Phase error due to comparator offset: $\alpha_{offset} = \arcsin(V_{offset}/V_{sw\_pk})$ Phase error due to delay in the comparator and switching circuitry: $\alpha_{comp}$ Phase error between the zero crossing of the motional current and voltage over de sense resistor due to the capacitive load $C_{load}$: $\alpha_{i-v} = \arctan(\omega * R_{sw} * C_{load})$ Example 1

In this example, the maximum tolerable comparator delay is calculated for starting up.

Suppose $F_{xtal}$=50 MHz $R_{sw}$ optimized for maximum swing $V_{sw\_pk}$ ($R_{sw}=X_{Cload}$)

$V_{sw\_pk}$=1 mV (initial peak voltage of the swing across the sense resistor)

$V_{offset\_max}$=0.5 mV (leakage+comparator)

This gives: $\alpha_{offset}$=30° and $\alpha_{i-v}$=45°. The maximum comparator phase shift therefore should be smaller than $\alpha_{comp}$=90−30−45=15° or $\Delta T_{comp}$<15/360*1/50*10$^6$<833 ps. So, next to the low tolerable offset the comparator should have also a large gain bandwidth product to keep the delay small enough.

In an example start-up circuit described in European patent 19153629.1 and U.S. patent application Ser. No. 16/751,233 the margin $\Delta T_{comp}$ is increased by detecting the polarity of the comparator offset and swapping the inputs in case the comparator offset is not negative as illustrated in Example 2 below.

Example 2

In this example the margin on $\alpha_{comp}$ is increased swapping the comparator inputs in case the comparator offset is not negative.

Suppose $F_{xtal}$=50 MHz $R_{sw}$ optimized for maximum swing $V_{sw\_pk}$ ($R_{sw}=X_{Cload}$)

$V_{sw\_pk}$=1 mV $V_{offset}$=0 mV (comparator, offset due to leakage supposed to be zero)

This gives: $\alpha_{offset}$=0°, $\alpha_{i-v}$=45° and $\alpha_{comp}$<45°→$\Delta T_{comp}$<2.5 ns. Now, the margin on the comparator delay is increased. The offset however still should be smaller than 1 mV ($V_{offset}$<$V_{sw\_pk}$) for starting up.

However, in many applications the initial peak voltage of the swing across the sense resistor is often even smaller which makes it difficult to detect in a robust way while keeping the delay small enough. Therefore detecting the polarity of the comparator offset and swapping the inputs in case the comparator offset is not negative may be result in unreliable start-up. For smaller package sized cheaper Crystals, the motional inductance may be larger which further reduces the maximum initial motional current and therefore reduces the maximum initial motional voltage swing over the switch $V_{sw\_pk}$. In addition Crystals with higher frequencies reduces the maximum allowable delay.

Figure 3:
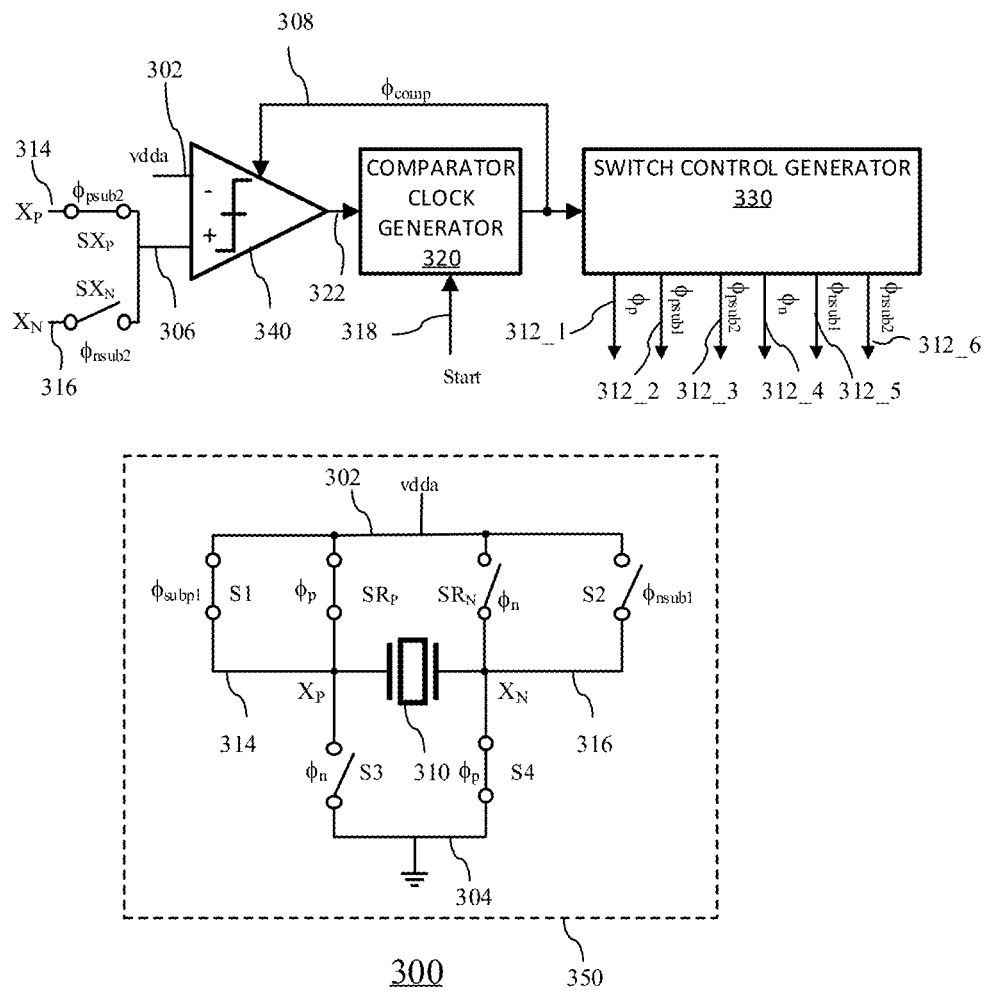
FIG. 3 shows a crystal oscillator start-up circuit according to an embodiment.

FIG. 3 shows a start-up circuit 300 for a crystal oscillator according to an embodiment. Start-up circuit 300 includes a comparator clock generator 320, a switch control generator 330, a comparator 340 and an H-Bridge circuit 350.

The H-Bridge circuit 350 includes a first switch S1, second switch S2, third switch S3, fourth switch S4, first sensing switch $SR_P$, and second sensing switch $SR_N$. The first sensing switch $SR_P$ and third switch S3 are arranged in series between a first supply node 302 which may be an analog supply vdda and a second supply node 304 which may be a ground. In other examples, the first supply node 302 may be a ground and second supply node 304 may be an analog supply vdda. In these examples the connections to the non-inverting input of the comparator 340 and the inverting input of the comparator 340 should also be swapped.

The second sensing switch $SR_N$ and the fourth switch S4 are connected in series between the first supply node 302 and the second supply node 304. A crystal resonator 310 has a first terminal $X_P$ which may be connected to a first common node 314 between switches $SR_P$ and S3 and a second terminal $X_N$ which may be connected to second common node 316 between switches $SR_N$ and S4. The first switch S1 may be connected between the first common node 314 and the first supply node 302. The second switch S2 may be connected between the second common node 316 and the first supply node 302.

The first sensing switch $SR_P$ and second sensing switch $SR_N$ may have an on-resistance value which is higher than the first switch S1 and the second switch S2.

The first supply node 302 may be connected to the inverting input of the comparator 340. A first comparison switch $SX_P$ may be connected between the first common node 314 and the non-inverting input 306 of comparator 340. A second comparison switch $SX_N$ may be connected between the second common node 316 and the non-inverting input 306 of comparator 340. The comparator output 322 may be connected to the comparator clock generator 320. The comparator clock output 308 configured to output comparator clock $\phi_{comp}$ may be connected to comparator 340 and to an input of the switch control generator 330. The comparator clock generator 320 may have start pulse input 318. The switch control generator outputs 312_1 to 312_6 output a respective timing control signal $\phi_p$, $\phi_{psub1}$, $\phi_{psub2}$, $\phi_n$, $\phi_{nsub1}$, $\phi_{nsub2}$, which may be connected to respectively control first switch S1 ($\phi_{psub1}$), second switch S2 ($\phi_{nsub1}$), third switch S3 ($\phi_n$), fourth switch ($\phi_p$), first sensing switch $SR_P$ ($\phi_p$), second sensing switch $SR_N$ ($\phi_n$), first comparison switch $SX_P$ ($\phi_{psub2}$) and second comparison switch $SX_N$ ($\phi_{nsub2}$).

The switches S1-S4, $SR_N$, $SX_P$ may typically be implemented as NMOS or PMOS transistors with the control signals $\phi_p$, $\phi_{psub1}$, $\phi_{psub2}$, $\phi_n$, $\phi_{nsub1}$, $\phi_{nsub2}$ from the switch control generator 330 being connected to a respective gate of each MOS transistor. For the start-up circuit 300 as illustrated, the first switch S1, second switch S2, first sensing switch $SR_P$, and second sensing switch $SR_N$ may be implemented with PMOS transistors. The third switch S3, and fourth switch S4 first may be implemented as NMOS transistors. The first comparison switch $SX_P$ and second comparison switch $SX_N$ may be implemented with PMOS transistors where vdda is the reference for the comparator 340.

In the following description, the term active is used to indicate the phase of a switch control signal in which the switches or circuitry controlled by that signal are closed or enabled.

The term inactive is used to indicate the phase of the switch control signal in which the switches or circuitry controlled by that signal are open or disabled. The switch control signal waveforms used to illustrate the operation of embodiments of the start-up circuit in various embodiments are shown as active high. However, it will be appreciated that, for example if the switch is implemented as a PMOS transistor, an active low signal is required and so the signal will be inverted to implement the desired operation of the respective switch.

Figure 4:
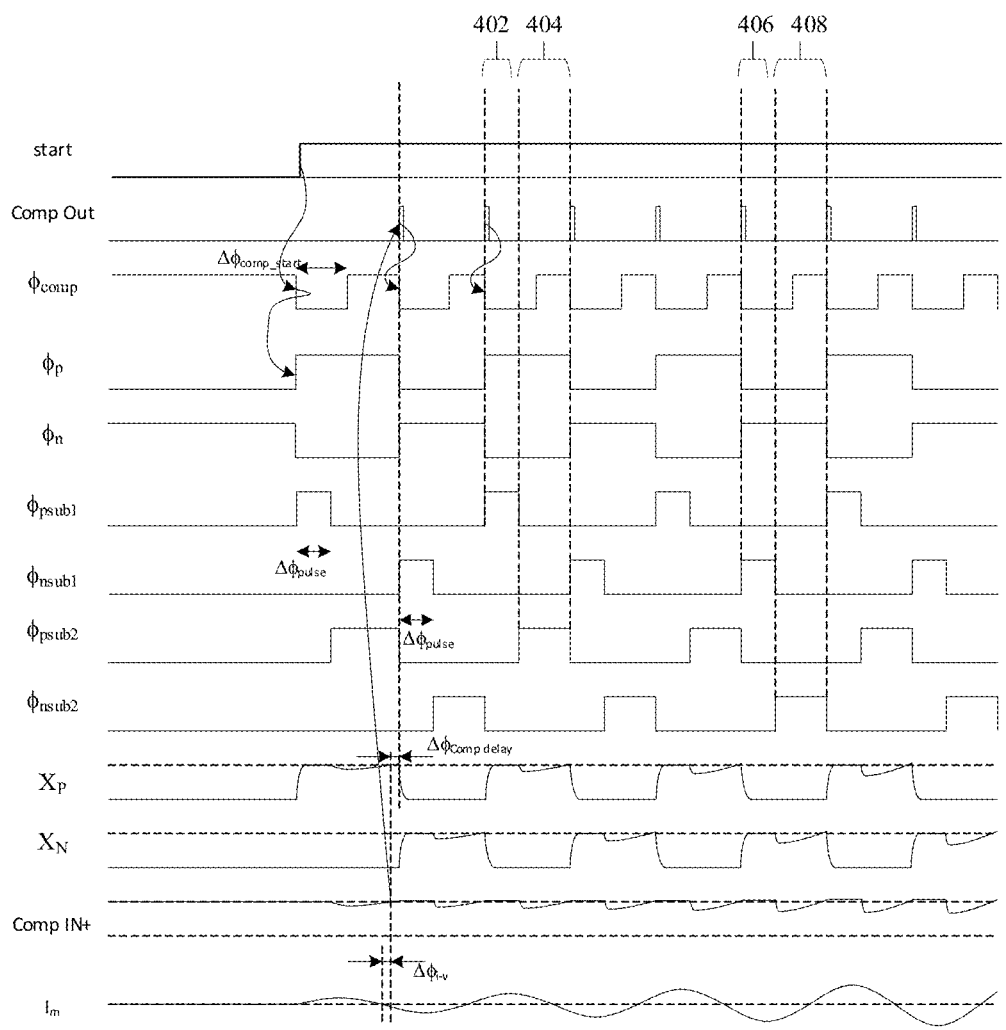
FIG. 4 illustrates waveforms during operation of the start-up circuit of FIG. 3.

The operation of the start-up circuit 300 is described with reference to FIG. 4 which illustrates example waveforms 400 during operation of the start-up circuit 300. The start-up is enabled with a "start" signal on start pulse input 318 which may for example be generated by a one shot circuit or any other suitable circuitry. Signal $\phi_{comp}$ which is generated by the comparator clock generator 320 has an initial transition as illustrated from high-to-low in response to the start pulse and then transitions again from low-to-high a predetermined delay time $\Delta \phi_{comp\_start}$ later. Subsequent high-to-low transitions are triggered from the comparator output 322

("comp out") each time the comparator 340 detects a zero-crossing. The comparator clock signal $\phi_{comp}$ controls when the comparator is active i.e. performing a comparison of the signals at the inputs and when it is inactive during which in some examples the comparator may perform a calibration.

The comparator clock signal $\phi_{comp}$ is received by the switch control generator 330 which generates the switch control signals derived from the comparator clock signal $\phi_{comp}$.

The control signal $\phi_p$ is in an active phase when the control signal $\phi_n$ is in an inactive phase and vice-versa. Control signal $\phi_{psub1}$ is a signal which is active during a first sub-phase 402 of the active phase of control signal $\phi_p$. Control signal $\phi_{psub2}$ is a signal which is active during a second sub-phase 404 of the active phase of control signal $\phi_p$. Similarly signals $\phi_{nsub1}$, $\phi_{nsub2}$ are active during first sub-phase 406 and second sub-phase 408 of the active phase of control signal $\phi_n$.

The first sub-phases 402, 406 may have an active time duration denoted $\Delta\phi_{pulse}$. The waveforms Xp and $X_N$ shows the variation of the voltage at the common nodes 314, 316 connected to the respective terminals of the crystal resonator 320. The signal "comp IN+" shows the signal at the non-inverting input 306 of comparator 340 and the signal $I_m$ shows the motional current.

Table 1 below shows the operation of the switches during the active phases of the switch control signals. Unless otherwise defined the switches are open.

TABLE 1

|  | $\phi_p$ active | | $\phi_n$ active | |
| --- | --- | --- | --- | --- |
|  | $\phi_{psub1}$ active | $\phi_{psub2}$ active | $\phi_{nsub1}$ active | $\phi_{nsub2}$ active |
| $SR_P$ | Closed | Closed | Open | Open |
| $SR_N$ | Open | Open | Closed | Closed |
| S1 | Closed | Open | Open | Open |
| S2 | Open | Open | Closed | Open |
| S3 | Open | Open | Closed | Closed |
| S4 | Closed | Closed | Open | Open |
| $SX_N$ | Open | Open | Open | Closed |
| $SX_P$ | Open | Closed | Open | Open |

During each comparison cycle where $\phi_p$ is active, during the first active sub-phase 402 when $\phi_{psub1}$ is active, in a first configuration switches S1 and $SR_p$ may be connected in parallel between the first common node 314 connected to the crystal resonator terminal (Xp) and the supply rail. The effective resistance will be the combination of the resistance of switches S1 and $SR_p$. The switch S1 may have a much lower on-resistance than SRp which may reduce the settling time of the voltage at node Xp. In particular, if switch S1 is implemented using a PMOS transistor then this may ensure that the node Xp is pulled all the way up to vdda.

In the second sub-phase 404, in a second configuration, switch S1 is open and $SR_p$ remains closed. The effective resistance between the supply rail 302 and the crystal resonator terminal Xp is now higher than in the first configuration. This may allow a zero-crossing to be detected more easily since the voltage drop across the resistance will be larger. In the second sub-phase 404 node Xp may also be coupled to the comparator 340 by switch $SX_P$. The comparator 340 is enabled by $\phi_{comp}$ after the start of the second sub-phase 404 which may be ensured by choosing $\Delta\phi_{comp\_start} > \Delta\phi_{pulse}$.

A zero-crossing in the voltage may be detected by the comparator 340 at some point during the second sub-phase 404, which will correspond to a zero crossing of the motional current $I_m$ after phase delay $\Delta\phi_{i-v}$. After a further delay through the comparator $\Delta\phi_{comp\_delay}$ the polarity of the voltage applied to the crystal 310 is reversed i.e. $\phi_p$ becomes inactive and $\phi_n$ becomes active. The comparison cycle then repeats in a similar way with $\phi_n$ active.

The start-up circuit 300 may provide a more robust self-timed start-up for crystal oscillators. Since the comparator has a defined comparison enable time each cycle, which occurs during the respective second sub-phase, the comparator may perform offset compensation when not comparing to improve the sensitivity of detection. Further, since the start up circuit has a defined first sub-phase, the additional switches S1,S2 of the H-bridge circuit may be implemented using optimal transistors to minimise the settling time by reducing the resistance between the power supply node 302 and the respective terminal of the crystal resonator 310.

In some examples the first sensing switch $SR_P$, and second sensing switch $SR_N$ may be implemented by multiple transistors in parallel which may be individually selectable which may be denoted $SR_{P1}$, $SR_{P2}$, $SR_{P3}$ ... $SR_{Pn}$ and $SR_{N1}$, $SR_{N2}$, $SR_{N3}$ ... $SR_{Nn}$. This may allow the effective sense resistance to be changed each comparator clock cycle. For example, on initial start-up, the sense resistance value may need to be relatively high to detect a voltage drop since the initial amplitude of the oscillation is relatively small. A relatively high sense resistance may be provided by configuring the switches in first and second configurations during the different subphases as explained above and by selecting for example only $SR_{P1}$ or $SR_{N1}$ dependent on the switch clock phase. After several comparator clock cycles, the amplitude may have increased and so the sense resistance value may be reduced for each cycle. In this case, the first and second configurations described above may be replaced by third and fourth configurations where for example when $\phi_p$ is active $SR_{P1}$, $SR_{P2}$, $SR_{P3}$ are selected instead of just $SR_{P1}$, and similarly when $\phi_n$ is active $SR_{N1}$, $SR_{N2}$, $SR_{N3}$ are selected instead of $SR_{N1}$. In third and fourth configurations, the effective sense resistance value is reduced compared to the first and second configurations.

Reducing the sense resistance value may reduce the start-up time required. The determination of when to change the sense resistance value may be made for example by a counter (not shown) coupled to the comparator clock output or and amplitude detector (not shown) connected to the crystal resonator terminals $X_N$, $X_P$.

Start-up circuits using an external clock, need to have a very accurate clock, which can be an integrated oscillator. The required accuracy (frequency deviation <<0.2%) of the integrated oscillator is difficult to achieve and also requires a lot of area and power. The requirements of the integrated oscillator can be relaxed by techniques like calibrating, dithering injection, chirp injection or synchronized injection. However, the efficiency in terms of start-up time reduction, and energy saving is rather low. The self-timed injection start-up circuit 300 solves the accuracy problems, since no (accurate) external clock is needed and allows energy to be injected with small enough delay (phase difference) with respect to the motional current phase for reliable start-up operation.

Figure 5:
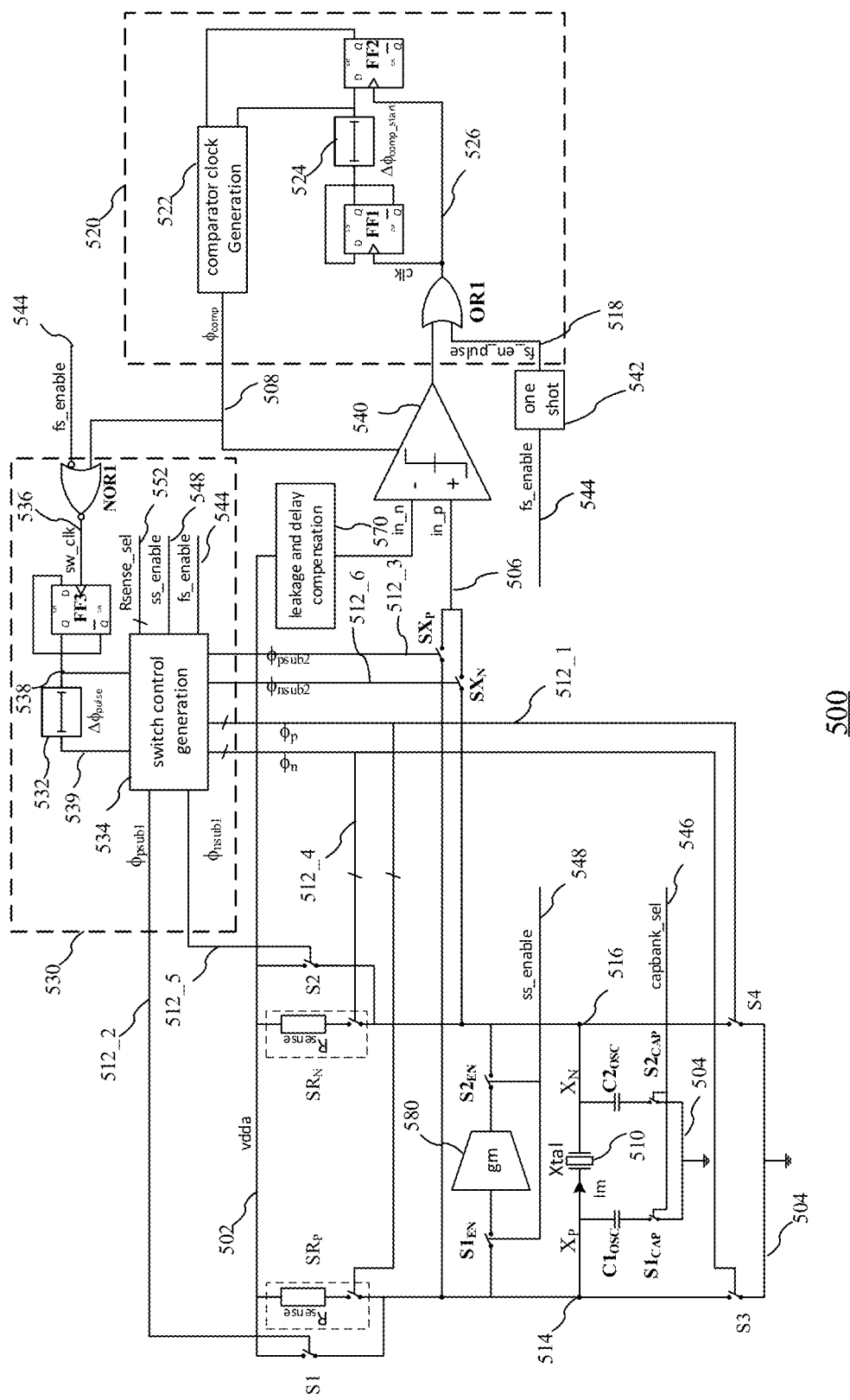
FIG. 5 Shows a crystal oscillator circuit including a start-up circuit according to an embodiment.

FIG. 5 shows a crystal oscillator circuit 500 according to an embodiment having a start-up circuit and a steady state oscillator circuit 580 coupled via switches $S1_{EN}$ and $S2_{EN}$ to the crystal resonator 510 and controlled by steady state control line 548 (ss_enable).

The start-up circuit for a crystal includes a comparator clock generator 520, a switch control generator 530 and a comparator 540. The start-up circuit of crystal oscillator circuit 500 may have an H-Bridge circuit including a first switch S1, second switch S2, third switch S3, fourth switch, first sensing switch $SR_P$, and second sensing switch $SR_N$. The first sensing switch $SR_P$ and third switch S3 are arranged in series between a first supply node 502 which may be an analog supply vdda and a second supply node 504 which may be a ground. The first sensing switch $SR_P$ and second sensing switch $SR_N$ may be a single switch and sense resistance or multiple individually selectable switches and sense resistances arranged in parallel. In some examples the sense resistance may be the on-channel resistance of a MOS switch and so the function of the switch and the $R_{sense}$ resistance may be combined. In other examples, the first supply node 502 may be a ground and second supply node 504 may be an analog supply vdda. In these examples the connections to the non-inverting input of the comparator 540 and the inverting input of the comparator 540 should also be swapped.

The second sensing switch $SR_N$ and the fourth switch S4 are connected in series between the first supply node 502 and the second supply node 504. A crystal resonator 510 may be connected between a first terminal $X_P$ connected to a first common node 514 between switches $SR_P$ and S3 and a second terminal $X_N$ connected to a second common node 516 between switches $SR_N$ and S4. The first switch S1 may be connected between the first common node 514 and the first supply node 502. The second switch S2 may be connected between the second common node 516 and the first supply node 502.

A first capacitor $C1_{OSC}$ and first capacitor switch $S1_{CAP}$ may be connected between the first common node 514 and ground 504. A second capacitor $C2_{OSC}$ and second capacitor switch $S2_{CAP}$ may be connected between the second common node 516 and ground 504. The first capacitor switch $S1_{CAP}$ second capacitor switch $S2_{CAP}$ may be controlled by the select input 546 (capbank_sel). In some examples a bank of capacitors and switches may be arranged in parallel between the first common node 514 and ground 504 and between the second common node 516 and ground 504 so that the load capacitance can be varied.

The first sensing switch $SR_P$ and second sensing switch $SR_N$ may have an on-resistance $R_{sense}$ value which is higher than the first switch S1 and the second switch S2.

A first comparison switch $SX_P$ may be connected between the first common node 514 and the non-inverting input 506 of comparator 540. A second comparison switch $SX_N$ may be connected between the second common node 516 and the non-inverting input 506 of comparator 540. The comparator output 522 may be connected to the comparator clock generator 520. The inverting input of the comparator 540 may be connected via the optional leakage and delay compensation module 570 to the first supply node 502.

The comparator clock generator 520 includes an or gate OR1 having a start input 518 connected to an output of a one-shot circuit 542. The input of the one-shot circuit 542 is connected to the faster enable 544. The output 526 of the or gate OR1 may be connected to a clock input of a first flip-flop FF1 and a second flip-flop FF2. The first flip-flop FF1 inverting output Qbar may be connected to the D input of the first flip-flop FF1. The noninverting output Q may be connected to a comparator clock delay element 524. The output of the comparator clock delay element 524 having a predetermined delay time $\Delta\phi_{comp\_start}$ may be connected to the D input of the second flip-flop FF2. The output of the comparator clock delay element 524 may also be connected to an input of the comparator clock generation module 522 which may be an exclusive-or (EXOR) function. The non-inverting output Q of the second flip-flop FF2 may be connected to a second input of the comparator clock generation module 522. The output of the comparator clock generation module 522 is connected to the clock generator output 508 which provides $\phi_{comp}$.

The comparator clock output 508 ($\phi_{comp}$) may be connected to comparator 540 and to a first input of a NOR gate NOR1 of the switch control generator 530. A second inverting input of the NOR gate NOR1 may be connected to the fast start enable input 544. The NOR gate output 536 may be connected to a clock input of a third flip-flop FF3 which may be referred to as a switch control flip-flop. The data input of the third flip-flop FF3 may be connected to the inverting output Qbar of the third flip-flop FF3 to configure the third flip-flop as a toggle flip-flop. The non-inverting output Q of the third flip-flop FF3 may be connected to a second delay element 532 which may have a predetermined delay time denoted $\Delta\phi_{pulse}$. The non-inverting output Q of the third flip-flop FF3 may be connected to a first input 538 of the switch control generation module 534. The output of the second delay element 532 may be connected to a second input 539 of the switch control generation module 534. The switch control generation module 534 may have a first control input 552 for selecting the sense resistance value (Rsense_sel). The switch control generation module 534 may have a second control input connected to the fast start enable input 544. The switch control generation module 534 may have a third control input connected to the steady-state enable input 548.

The switch control generator outputs 512_1 to 512_6 output a respective control output 512_1($\phi_p$), 512_2 ($\phi_{psub1}$), 512_3 ($\phi_{psub2}$), 512_4 ($\phi_n$), 512_5 ($\phi_{nsub1}$), 512_6 ($\phi_{nsub2}$).

Switch control generator output 512_1 may be connected to first sensing switch $SR_P$ and fourth switch S4. Switch control generator output 512_2 may be connected to first switch S1. Switch control generator output 512_2 may be connected to first comparison switch $SX_P$. Switch control generator output 512_4 may be connected to second sensing switch $SR_N$ and third switch S3. Switch control generator output 512_5 may be connected to second switch S2. Switch control generator output 512_6 may be connected to second comparison switch $SX_N$.

Control outputs 512_1, 512_4 may be a single or multiple wires. Multiple connections may allow different combinations of switches in first sense switch $SR_P$ and second sense switch $SR_N$ to be selected dependent on the desired sense resistance value $R_{sense}$.

The switches may typically be implemented as NMOS or PMOS transistors dependent on the reference voltage used with the control lines 516_1 to 516_6 from the switch control generator 530 being connected to a respective gate of each MOS transistor. For the circuit 500 as illustrated, the first switch S1, second switch S2, first sensing switch $SR_P$, and second sensing switch $SR_N$ may be implemented with one or more PMOS transistors. The third switch S3, and fourth switch S4 may be implemented as NMOS transistors. The first comparison switch $SX_P$ and second comparison switch $SX_N$ may be implemented as PMOS transistors as vdda is the reference used.

The switches S1, S2 connected to vdda node 502 are controlled by the signals $\phi_{psub1}$ and $\phi_{nsub1}$. The switches S3, S4 connected to the ground 504 are controlled by the signals $\phi_p$ and $\phi_n$. These switches are low ohmic to ensure settling within $\Delta\phi_{pulse}$. A low ohmic resistance may correspond to a switch resistance $R_{sw}$ having a resistance satisfying the following relation:

$$R_{sw} < \frac{\Delta\phi_{pulse}}{5C_{osc}}$$

The switches should be low ohmic enough to ensure settling within $\Delta\phi_{pulse}$ with a final error approximately smaller than the detectable motional voltage swing over $R_{sense}$. Typically depending on the application $R_{sw}$ should be lower than a few 100 ohms The motional current $I_m$ is measured by measuring the voltage over $R_{sense}$ which can be the switch resistance itself or a separate resistance in series with a switch. After $\Delta\phi_{pulse}$, the respective closed switch S1 or S2 to vdda 502 is opened to start sensing the voltage over the resistance $R_{sense}$ of the respective sensor switches $SR_N$, $SR_P$. Because of the low resistance of the switches $R_{SW}$ the settling time may be reduced.

The maximum allowable value for the value of $R_{sense}$ depends on maximum allowable $\Delta\phi_{i-v}$ and the capacitance $C_{osc}$ at $X_P$ and $X_N$ respectively. The voltage over $R_{sense}$ is equal to:

$$V_{R_{sense}} = \frac{R_{sense}}{1 + j\omega R_{sense} C_{osc}} \text{Im}$$

So, the maximum value of $V_{R_{sense}}$ is achieved for $R_{sense} = |Xc| = 1/\omega C_{osc} (\Delta\phi_{i-v} = 45°)$:

$$V_{R_{sense}} = \frac{R_{sense}}{\sqrt{2}} \text{Im} \wedge \Delta\phi_{i-v} = \arctan(0.5) = 45°$$

The value of $R_{sense}$ is selectable for obtaining the optimum balance between the value of $V_{R_{sense}}$ and $\Delta\phi_{i-v}$. $R_{sense}$ for example can be decreased during start-up depending on the increasing value of the motional current Im(t) to reduce the phase shift $\Delta\phi_{i-v}$ and to decrease further the start-up time.

The comparator 540 may flip i.e. change state within a certain time after the zero crossing of the sensed voltage $V_{R_{sense}}$. The amplitude of $V_{R_{sense}}$ ($A_{R_{sense}}$) however can be much smaller than 1 mV (e.g. 200 µV). The comparator 540 should also change state within a certain time to assure an increase of the motional current Im:

$$\Delta t_{max} = \frac{\Delta\phi_{comp\_delay\_max}}{360° * F_{xo}} \wedge \Delta\phi_{comp\_delay\_max} < 90° - \Delta\phi_{i-v}$$

Therefore the comparator offset should be much smaller than the minimum amplitude of $V_{R_{sense}}$. so much smaller than 200 µV (e.g. <20 µV). The gain bandwidth product should be large enough to amplify the small signal without too much delay. The reference voltage at the inverting input in_n of the comparator 540 can be vdda (Vin_n=vdda). To improve further the performance the reference voltage at comparator inverting input in_n may be reduced by "leakage delay and compensation circuit" 570 which may compensate for a possible voltage drop on non-inverting input 506 (in_p) due to leakage of the switches and also the pad of the device including the crystal oscillator circuit due to ESD clamps. The leakage and delay compensation circuit 570 may also compensate for the delay between the zero crossing of the motional current and switching moment ($\Delta\phi_{comp\_delay\_max}$+ $\Delta\phi_{i-v}$). Voltage drop due to leakage can be compensated by copying the switches and pad to mimic the voltage drop on in_p due to leakage. In other examples, the voltage drop on non-inverting input 506 (in_p) of comparator 540 may be measured and added to the voltage at inverting input in_n of the comparator 540. The delay $\Delta\phi_{i-v}$ and $\Delta\phi_{comp\_delay}$ can be compensated by subtracting the voltage value:

$$\Delta V_{compensation} = A_{R_{sense}} \sin(\Delta\phi_{i-v} + \Delta\phi_{comp\_delay})$$

So, with leakage and delay compensation the voltage $V_{in\_n}$ is equal to $$V_{in\_n} = vdda - \Delta V_{leakage} - \Delta V_{compensation}$$

After $\Delta\phi_{pulse}$, depending on which of the two switches S1 or S2 just opened, the signal at Xp or Xn is equal to approximately vdda respectively and can be switched to the non-inverting input of the comparator (in_p) by $\phi_{psub2}/\phi_{nsub2}$. The comparison should start after the signal level falls below vdda$-\Delta V_{compensation}$. Without delay compensation and a negligible offset in the comparator the comparison should start between:

$$\Delta\phi_{pulse} < \Delta\phi_{comp\_start} < 180°$$

A realistic value for $\Delta\phi_{pulse} \approx 45°$ which is not critical as long Rsw is chosen low enough. Also $\Delta\phi_{comp\_start}$ is not critical and easy to achieve over process, voltage and temperature.

In some examples sensing may be done at the ground side 504 instead of the vdda. In other examples sensing also can be done in the capacitor bank, this however requires an integrated capacitor bank or two extra pins.

In operation of the start-up circuit 500, the control signal $\phi_p$ is active when the control signal $\phi_n$ is inactive and vice-versa.

Figure 6:
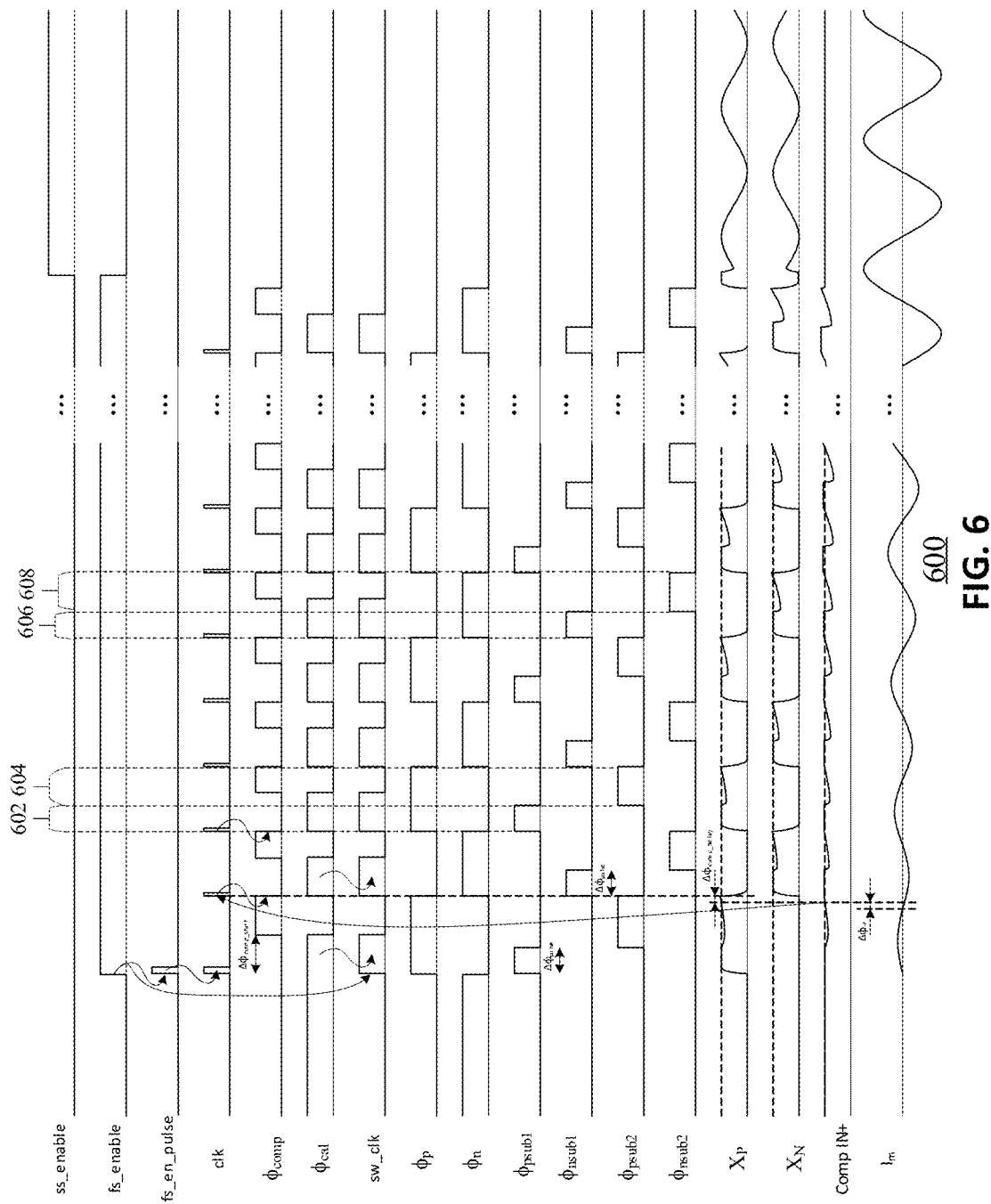
FIG. 6 illustrates waveforms during operation of the circuit of FIG. 5.

The operation is described with reference to circuit 500 and FIG. 6 which illustrates example waveforms 600 during operation of the start-up circuit 500 and the transition On start-up the fast start enable signal (fs_enable) is asserted and a single initial pulse "start pulse" may be generated by one-shot circuit 542 and received on start pulse input 518. This start pulse (fs_en_pulse) is output on the OR gate OR1 as the first clock pulse (elk). Subsequent clock pulses on the OR gate output 526 are generated by the comparator 540. The comparator clock output $\phi_{comp}$ which is generated by the comparator clock generator 520 has an initial transition from low-to-high a predetermined delay time $\Delta\phi_{comp\_start}$ after the first clock pulse. High-to-low transitions of comparator clock output are triggered from the output of comparator 540 each time the comparator 540 detects a zero-crossing of the motional current Im. In this example, low to high transitions of the comparator clock output occurring after delay time $\Delta\phi_{comp\_start}$ determined by delay element 524. The comparator clock signal $\phi_{comp}$ controls when the comparator is active i.e. performing a comparison of the signals at the inputs and when it is inactive during which in some examples the comparator may perform a calibration indicated by waveform $\phi_{cal}$.

The comparator clock signal $\phi_{comp}$ is received by the switch control generator 330 which when fast start is enabled generates the switch clock signal sw_clk from the comparator clock signal $\phi_{comp}$. Third flip-flop FF3 acts as a divide-by-two circuit to generate a signal of half the frequency of $\phi_{comp}$. The second delay element 532 may delay the output of the third flip-flip switch clock signal and provide a delayed switch control signal with a delay of $\Delta\phi_{pulse}$.

Similarly to start-up circuit 300, the control signal $\phi$ is active when the control signal $\phi v$ is inactive and vice-versa.

The control signal is in $\phi_p$ an active phase when the control signal $\phi_n$ is in an inactive phase and vice-versa. Control signal $\phi_{psub1}$ is a signal which is active during a first sub-phase 602 of the active phase of control signal $\phi_p$. Control signal $\phi_{psub2}$ is a signal which is active during a second sub-phase 604 of the active phase of control signal $\phi_p$. Similarly signals $\phi_{nsub1}$, $\phi_{nsub2}$ are active during first sub-phase 606 and second sub-phase 608 of the active phase of control signal $\phi_n$.

The first sub-phase 602, 606 may have a time duration denoted $\Delta\phi_{pulse}$. The waveforms Xp and $X_N$ shows the variation of the voltage at the common nodes 514, 516. The signal "in_p" shows the signal at the non-inverting input 506 of comparator 540 and the signal $I_m$ shows the motional current.

The operation of the switches during the active phases of the switch control signals when fast start is enabled (fs_enable=HIGH) is the same as described in Table 1. The oscillator capacitors $C1_{osc}$ and $C2_{osc}$ are preferable disconnected during the start-up phase (capbank_sel=LOW). Unless otherwise defined the switches are open.

During each comparison cycle where $\phi_p$ is active, in the first sub-phase 602, when $\phi_{psub1}$ is also active, switches S1 and $SR_p$ are connected between the first common node 514 and the supply rail 502. Switch S1 may have a much lower on-resistance than SRp which may reduce the settling time of the voltage at node 514. In particular, if switch S1 is implemented using PMOS transistor then it can ensure the node 514 is pulled all the way up to vdda. In the second sub-phase 604 when $\phi_{psub2}$ is active, node 514 is coupled to the comparator 540 by switch $SX_p$. The comparator 540 is enabled by $\phi_{comp}$ after the start of the second sub-phase 604 which may be ensured by choosing $\Delta\phi_{comp\_start} > \Delta\phi_{pulse}$.

A zero-crossing in the voltage may be detected by the comparator 540, which will correspond to a zero crossing of the current after phase delay $\Delta\phi_{i-v}$. After a further delay through the comparator $\Delta\phi_{comp\_delay}$ the polarity of the voltage applied to the crystal 510 is reversed i.e. $\phi_p$ becomes inactive and $\phi_n$ becomes active. The comparison cycle then repeats in a similar way with $\phi_n$ active.

The start-up circuit 500 may provide a more robust self-timed start-up for crystal oscillators. Since the comparator has a defined comparison enable time each cycle, the comparator may perform offset compensation when not comparing to improve the sensitivity of detection. Further, since the start up circuit has a defined first sub-phase, the additional switches S1,S2 of the H-bridge circuit may be implemented using optimal transistors to minimise the settling time.

Once the start-up phase has been completed, the fast start circuitry may be disabled (fs_enable=LOW) and the steady state circuitry enabled (ss_enable=HIGH). The switches of the H-bridge can then be open circuit and comparator 540 powered down. The gm stage 580 will then keep the crystal resonator 510 in oscillation.

In some examples, the capacitor bank value determined by the select input capbank_sel and $R_{sense}$ value can be changed over start-up time for improved performance (e.g. reducing $\Delta\phi_{i-v}$ for faster start-up). In some examples this can be done counting the number of clock pulses generated from the comparator output and comparing to one or more predetermined values or alternatively with an "amplitude detector" (not shown) measuring the voltage drop over $R_{sense}$ and comparing the result with one or more predetermined values. Similarly the determination of the transition from start up to steady state mode may be also determined dependent on a counter value from a counter coupled to the comparator output (not shown) or voltage drop measured with an amplitude detector.

Figure 7A:
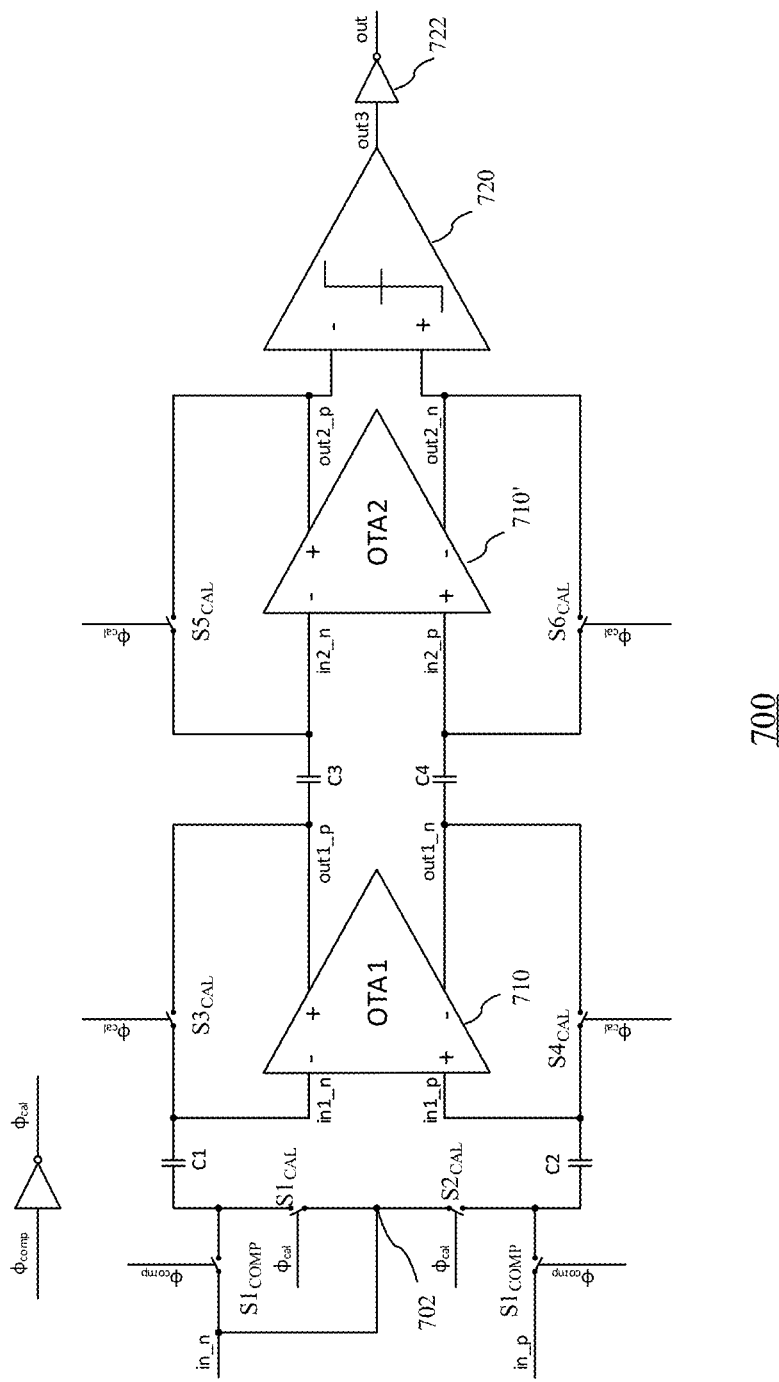
FIG. 7A illustrates a comparator for a start-up circuit according to an embodiment.
Figure 7B:
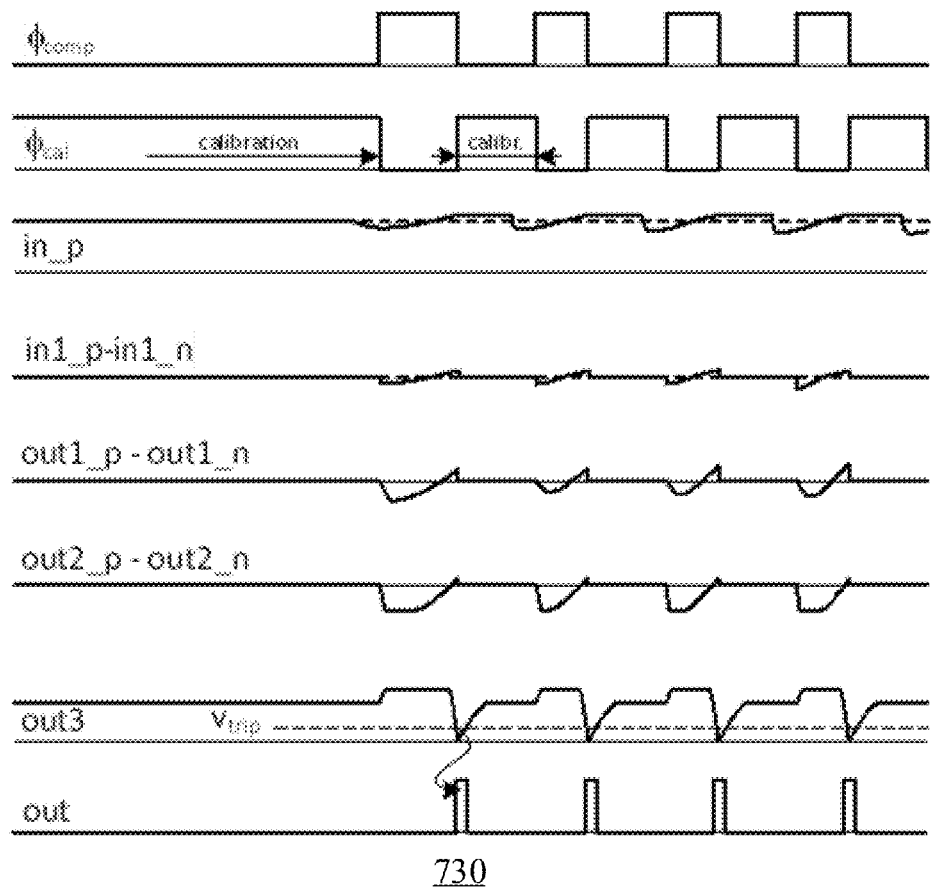
FIG. 7B illustrates waveforms during operation of the comparator of FIG. 7A.

FIG. 7A shows a possible implementation of a comparator 700 with offset cancellation which may be used to implement comparator 340 or comparator 540. The waveforms are illustrated in FIG. 7B. The comparator 540 not only has offset cancellation, but also a very high gain bandwidth product which is needed for measuring the zero crossings of the very small signal and flipping within a short time after the zero crossing. Comparator 700 has a series arrangement of two operational transconductance amplifiers (OTAs) 710, 710' with offset cancellation and a final comparator stage 720 which may generate high enough gain with low enough delay between sensing the zero crossing and flipping the output. During the comparison cycle the inputs in_n and in_p are coupled via capacitors C1 and C2 to the respective inputs of OTA1 710 by switches $S1_{COMP}$ and $S2_{COMP}$ controlled by the comparison clock $\phi_{comp}$. The outputs of OTA1 are coupled to the inputs of OTA2 via respective capacitors C3 and C4.

A series arrangement of calibration switches $S1_{CAL}$ and $S2_{CAL}$ controlled by the calibration clock signal $\phi_{CAL}$ are connected between the inverting input in_n and non-inverting input in_p of the comparator 700. The inverting input in_n of the comparator 700 is connected to common node 702 between the switches $S1_{CAL}$ and $S2_{CAL}$ controlled by the calibration clock signal $\phi_{CAL}$.

During the calibration cycle the inverting input in_n is coupled via capacitors C1 and C2 to both inputs of OTA1 710. In addition, the inputs of OTA1 710 are connected to the outputs using switches $S3_{CAL}$ and $S4_{CAL}$ controlled by the calibration clock signal $\phi_{CAL}$. Similarly the inputs of OTA2 710' are connected to the outputs using switches $S5_{CAL}$ and $S6_{CAL}$ controlled by the calibration clock signal $\phi_{CAL}$.

The output common mode voltage including the inverse offset voltage is then stored on the capacitors C1, C2. Because the inverse offset voltage is stored on the capacitors C1, C2, before the comparator 700 changes to the comparison mode, this inverse offset voltage compensates for the offset of the comparator. This offset compensation improves the sensitivity of the comparator 700 which allows the comparator 700 to compare smaller voltages.

The final comparator 720 is a simple single ended OTA followed by an inverter 722. The inverter 722 may have a shifted trip-level (vtrip) to ensure that the output (out) doesn't flip due to the offset at the final comparator input and the offset of the inverter 722. Due to the large amplification of OTA1 710 and OTA2 710', no offset calibration is needed for the final stage. In some examples, offset calibration can be also implemented for the last stage 720.

As there is a trade-off between gain and speed the gain can be reduced at the cost of sensitivity but higher response time by, for example, removing one gain stage (OTA2). The sensitivity also can be increased by increasing the gain which may result in lower response time.

Figure 7C:
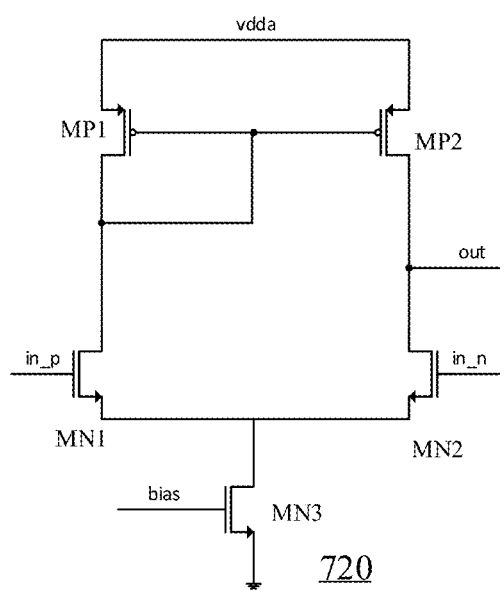
FIG. 7C shows a circuit implementation of an output stage of the comparator of FIG. 7A.

FIG. 7C shows an example implementation a single-ended OTA 720 to serve as final comparator in the novel robust offset-cancelled comparator solution.

Figure 7D:
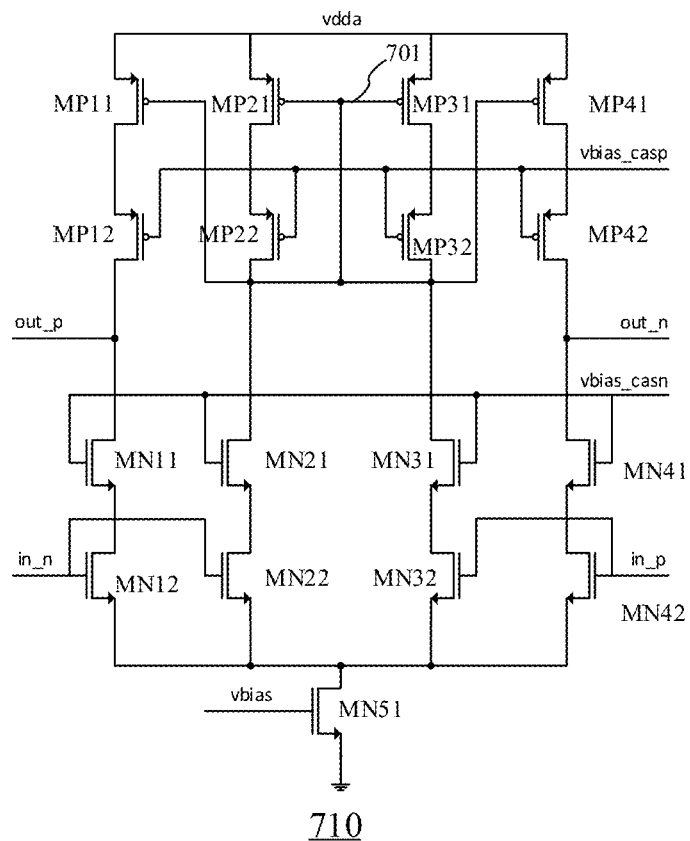
FIG. 7D shows a circuit implementation of a differential OTA for the comparator of FIG. 7A.

FIG. 7D shows an example transistor-level implementation of fully differential OTA 710 with self-biased common mode output including cascodes. Transistor MN51 is the current source of the differential input pair MN12, MN42 and the biasing branches in between. If the differential voltage between in_n and in_p is zero, then the differential voltage between out_p and out_n is zero with a common mode voltage equal to the rail voltage 701. During calibration in_n is connected with out_p and in_p is connected with out_n. Since the input is capacitive coupled, both the common mode output as well the input is equal to the rail voltage 701. The NMOS devices MN11, MN21, MN31, MN41 connected to the rail vbias_casn and the PMOS devices MP12, MP22, MP32, MP42 are cascodes to increase the gain of the OTA.

Figure 8:
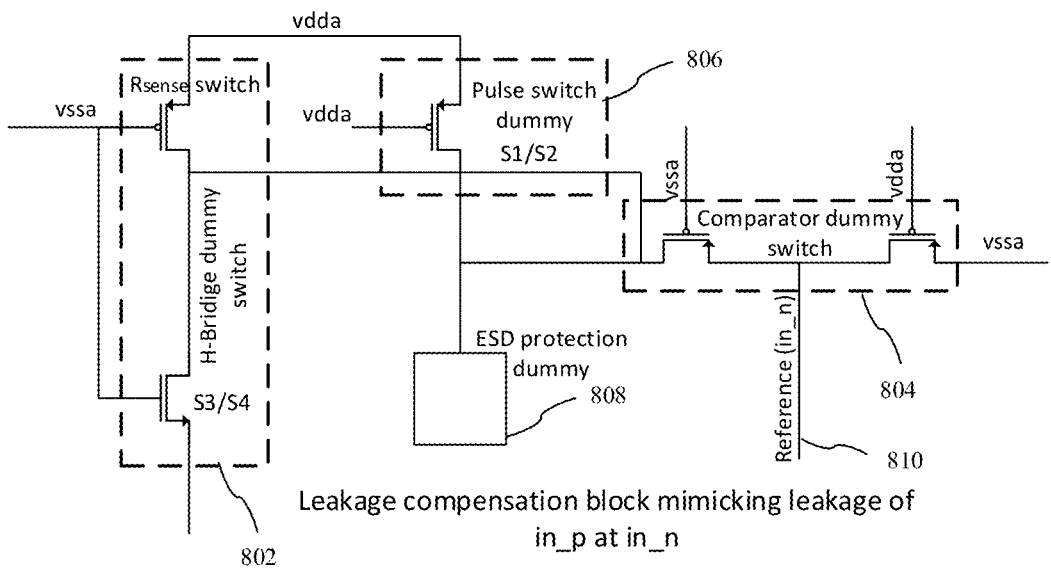
FIG. 8 shows an example leakage compensation circuit for the crystal oscillator circuit of FIG. 5.

FIG. 8 shows an example implementation of the leakage and delay compensation circuit 800 which may for example be used to implement leakage and delay compensation circuit 570. Leakage and delay compensation circuit 800 includes H-bridge dummy switch 802, pulse dummy switch 806, ESD protection dummy 808 and comparator dummy switch 804. The reference 810 is provided to the inverting comparator input which compensates for the leakage and delay on the non-inverting comparator input.

Figure 9:
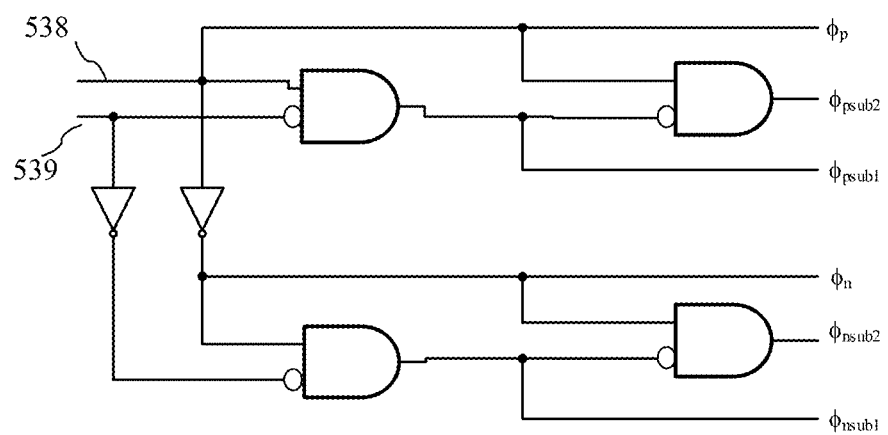
FIG. 9 shows an example implementation of the logic for switch clock generation.

FIG. 9 shows an example logic circuit 900 to implement part of the switch control module 534. The input 538 corresponds to the switch control signal output of the third flip-flop FF3 and the input 539 corresponds to the delayed switch control signal output from the second delay element 532.

Figure 10:
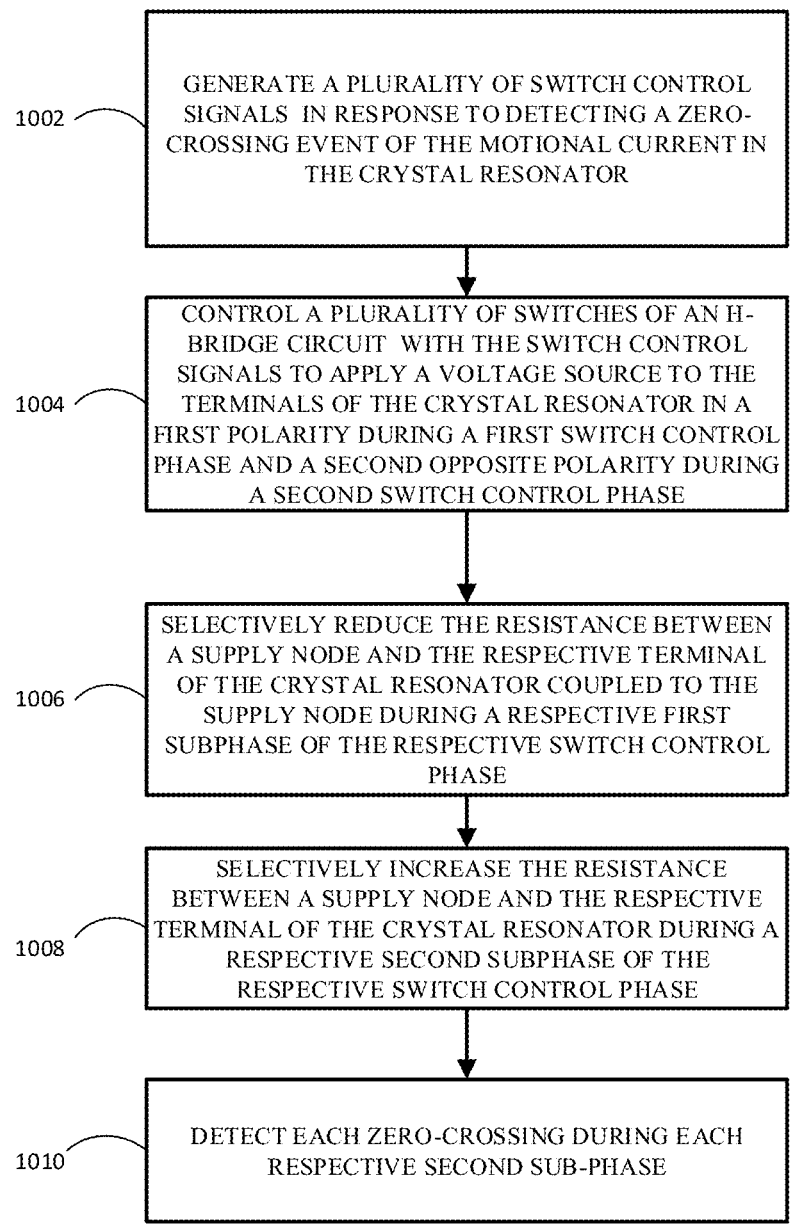
FIG. 10 shows a method of self-timed start-up of a crystal resonator according to an embodiment.

FIG. 10 shows a method of self-timed start-up of a crystal oscillator 1000. In step 1002 a plurality of switch control signals may be generated in response to detecting a zero-crossing event of the motional current in the crystal resonator. In step 1004 a plurality of switches of an H-bridge circuit may be controlled by the switch control signals to apply a voltage source to the terminals of the crystal resonator in a first polarity during a first switch control phase and a second opposite polarity during a second switch control phase. In step 1006 the switches may be controlled to selectively reduce the resistance between a supply node and the respective terminal of the crystal resonator coupled to the supply node during a respective first subphase of the respective switch control phase. In step 1008, the resistance between a supply node and the respective terminal of the crystal resonator is selectively increased during a respective second subphase of the respective switch control phase. In step 1010 each zero-crossing is detected during each respective second sub-phase of the respective switch control phase.

A circuit and method for starting-up a crystal oscillator is described. A crystal resonator is configured to be coupled to a start-up circuit including an H-bridge circuit having a number of switches. A plurality of switch control signals are generated in response to detecting a zero-crossing event of the motional current in the crystal resonator. The switches of the H-bridge circuit are controlled by the switch control signals to apply a voltage to the terminals of the crystal resonator in a first polarity during a first switch control phase and a second opposite polarity during a second switch control phase. During a respective first subphase of the respective switch control phase, the plurality of switches are configured in a first configuration to couple the supply node to a respective crystal resonator terminal. During a respective second subphase of the respective switch control phase the plurality of switches are configured in a second configuration to couple the supply node to the respective crystal resonator terminal. The resistance between the supply node and the respective crystal resonator terminal is larger in the second configuration than the first configuration. A zero-crossing is detected during each respective second subphase.

Embodiments herein describe a robust fast start-up crystal oscillator (XO) solution, reducing the start-up time and energy. Embodiment do not require an external clock and provides a robust solution. Embodiments may reduce the total start-up time and the average power in systems, like Bluetooth Low Energy (BLE), car key applications and IoT systems in general.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A crystal oscillator start-up circuit comprising:
   an H-bridge circuit comprising a plurality of switches configured to be coupled to a crystal resonator;
   a comparator having a first comparator input configured to be switchably coupled to a terminal of the crystal resonator, a second comparator input configured to be coupled to a supply node, a comparator clock input, and a comparator output configured to transition between a first state and a second state in response to a zero-crossing event of the motional current in the crystal resonator;
   a comparator clock generator having a first comparator clock generator input coupled to the comparator output, a second comparator clock generator input configured to receive a start signal, and a comparator clock generator output coupled to the comparator clock input;
   a switch control generator coupled to the comparator clock output and configured to generate a plurality of switch control signals synchronous with respect to the comparator clock to control the plurality of switches, the plurality of switches being configurable to apply a voltage to the crystal resonator terminals in a first polarity during a first switch control phase and a second opposite polarity during a second switch control phase and wherein during a respective first subphase of the respective switch control phase, the plurality of switches are configured in a first configuration to couple a supply node to a respective crystal resonator terminal; and during a respective second subphase the plurality of switches are configured in a second configuration to couple the supply node to the respective crystal resonator terminal;

wherein the resistance between the supply node and the respective crystal resonator terminal is larger in the second configuration than the first configuration; and wherein the switch control generator is further configured to couple the first comparator input to the respective crystal resonator terminal during of each of the respective second sub-phases.

2. The crystal oscillator start-up circuit of claim 1 configured to alternate between the first switch control phase and the second switch control phase each cycle of the comparator clock.

3. The crystal oscillator start-up circuit of claim 1 wherein the comparator is configured to calibrate a comparator offset voltage during a first phase of the comparator clock cycle and to compare the inputs during a second phase of the comparator clock cycle.

4. The crystal oscillator start-up circuit of claim 3 wherein the comparator is enabled during each respective second subphase.

5. The crystal oscillator start-up circuit of claim 3 wherein the comparator comprises:
 a differential amplifier stage comprising:
  an operational transconductance amplifier, OTA;
  a first capacitor coupled to a first OTA input;
  a second capacitor coupled to a second OTA input, wherein the comparator is configured to receive the comparator clock which defines a calibration phase and a comparison phase, wherein during the calibration phase the comparator is configured to control a plurality of comparator switches to:
   switchably couple the first comparator input to the first OTA input via the first capacitor; and switchably couple the second comparator input to the second OTA input via the second capacitor; and
  wherein during the comparison phase, the comparator is configured to control the plurality of comparator switches to:
   switchably couple the first comparator input to the first OTA input via the first capacitor and to the second OTA input via the second capacitor; and
   switchably couple a first OTA output to the first OTA input, and a second OTA output to the second OTA input.

6. The crystal oscillator start-up circuit of claim 5 wherein the comparator further comprises a single ended output stage OTA coupled to the output of the differential amplifier stage and having a first input coupled to a first OTA output of the differential amplifier stage, a second input coupled to the second OTA output, and an output coupled to a buffer wherein the buffer is configured to have a shifted voltage trip level.

7. The crystal oscillator start-up circuit of claim 1 wherein the plurality of switches further comprises:
 a first switch and a third switch arranged in series between the supply node and a second supply node;
 a second switch and a fourth switch arranged in series between the supply node and the second supply node;
 a first sensing switch arranged in parallel with the first switch;
 a second sensing switch arranged in parallel with the second switch;
 a first common node of the first switch and the third switch configured to be coupled to a first crystal resonator terminal and a second common node of the second switch and the fourth switch configured to be coupled to a second crystal resonator terminal.

8. The crystal oscillator start-up circuit of claim 7 wherein during the first switch control phase, the switch control generator is further configured to:
 close the first sensing switch and the fourth switch and during the first sub-phase of the first switch control phase close the first switch; and during the second sub-phase of the first switch control phase, open the first switch; and
during the second switch control phase, the switch control generator is configured to:
 close the second sensing switch and the third switch and during the first sub-phase of the second switch control phase close the second switch; and during the second sub-phase of the second switch control phase open the second switch.

9. The crystal oscillator start-up circuit of claim 1 further comprising:
 a first comparison switch coupled between the first crystal resonator terminal and the first comparator input; and
 a second comparison switch coupled between the second crystal resonator terminal and the first comparator input;
 wherein the switch control generator is further configured to:
  close the first comparison switch during the second sub-phase of the first switch control phase; and
  close the second comparison switch during the second sub-phase of the second switch control phase.

10. The crystal oscillator start-up circuit of claim 1 wherein after at least two comparator clock cycles:
 during a respective first subphase of the respective switch control phase, the plurality of switches are configured in a third configuration to couple the supply node to a respective crystal resonator terminal; and
 during a respective second subphase the plurality of switches are configured in a fourth configuration to couple the supply node to the respective crystal resonator terminal;
 wherein the resistance between the supply node and the respective crystal resonator terminal is larger in the fourth configuration than the third configuration and less than the second configuration.

11. The crystal oscillator start-up circuit of claim 10, wherein the switch control generator is configured to control the plurality of switches to be configured in either the first and second configurations or the third and fourth configurations dependent on at least one of the number of comparator clock cycles and an amplitude of the crystal resonator signal.

12. The crystal oscillator start-up circuit of claim 1 further comprising a current leakage and delay compensation circuit coupled between a supply node and the second comparator input.

13. The crystal oscillator start-up circuit of claim 1 further comprising a one-shot circuit having an input coupled to a start enable input and an output coupled to the second comparator clock generator input.

14. The crystal oscillator start-up circuit of claim 1 wherein the comparator clock generator further comprises a series arrangement of a first flip-flop, a delay element and a second flip-flop and an OR gate having first input coupled to the first comparator clock generator input, a second input coupled to the second comparator clock generator input and an output coupled to the clock inputs of the first and second flip-flops wherein the first flip-flop is configured as a toggle flip-flop and wherein the comparator clock output is an EXOR of the delayed output of the first flip-flop and the output of the second flip-flop.

15. The crystal oscillator start-up circuit of claim 1 wherein the switch control generator comprises a logic gate having a first input switch coupled to a start enable input, a second input coupled to the comparator clock generator output and a switch control flip-flop configured as a toggle flip-flop having a clock input coupled to the logic gate output and an output coupled to a second delay element; and a switch control logic module coupled to the switch control flip-flop output and the delayed switch control flip-flop output and configured to generate the switch control signals from the switch control flip-flop output and the delayed switch control flip-flop output from the second delay element.

16. The crystal oscillator start-up circuit of claim 15 wherein the first switch control phase signal is provided by the switch control flip-flop output and the second switch control phase signal is provided by the inverse of the switch control flip-flop output.

17. A crystal oscillator circuit comprising the start-up circuit of claim 1 and further comprising a steady state circuit configured to be switchably coupled to the resonator crystal wherein during the start-up phase, the steady state circuit is decoupled from the resonator crystal and after the start-up phase, the H-bridge circuit is decoupled from the resonator crystal and the resonator crystal is coupled to the steady state circuit.

18. The crystal oscillator circuit of claim 17 further comprising an amplitude detector coupled to the resonator crystal wherein the circuit is configured to switch from the start-up phase to the steady-state phase in response to the amplitude exceeding a predetermined value.

19. The crystal oscillator start-up circuit of claim 1 included in one of an Internet-of-Things device, a Bluetooth Device, and an Ultra-Wide-Band Device.

20. A method of starting-up a crystal resonator configured to be coupled to a start-up circuit comprising an H-bridge circuit comprising a plurality of switches, the method comprising:
   generating a plurality of switch control signals in response to detecting a zero-crossing event of the motional current in the crystal resonator:
   controlling a plurality of switches of the H-bridge circuit with the switch control signals to apply a voltage to the terminals of the crystal resonator in a first polarity during a first switch control phase and a second opposite polarity during a second switch control phase;
   during a respective first subphase of the respective switch control phase, configuring the plurality of switches in a first configuration to couple the supply node to a respective crystal resonator terminal; and
   during a respective second subphase of the respective switch control phase configuring the plurality of switches in a second configuration to couple the supply node to the respective crystal resonator terminal;
   wherein the resistance between the supply node and the respective crystal resonator terminal is larger in the second configuration than the first configuration; and
   the method further comprising detecting each zero-crossing during each respective second sub-phase.

* * * * *